United States Patent
Ciccarelli et al.

(10) Patent No.: US 7,024,169 B2
(45) Date of Patent: Apr. 4, 2006

(54) AMPS RECEIVER USING A ZERO-IF ARCHITECTURE

(75) Inventors: Steven C. Ciccarelli, Encinitas, CA (US); Arun Raghupathy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 434 days.

(21) Appl. No.: 10/160,873

(22) Filed: May 31, 2002

(65) Prior Publication Data

US 2003/0143967 A1 Jul. 31, 2003

Related U.S. Application Data

(60) Provisional application No. 60/351,868, filed on Jan. 25, 2002.

(51) Int. Cl.
*H04B 1/06* (2006.01)

(52) U.S. Cl. .................. 455/232.1; 455/205; 455/324; 455/334; 375/345

(58) Field of Classification Search ................ 455/131, 455/138, 313, 323, 324, 339, 205, 232.1, 455/234.1, 231.1, 334; 375/327, 345, 322, 375/329
See application file for complete search history.

(56) References Cited

U.S. PATENT DOCUMENTS 5,083,304 A 1/1992 Cahill ........................ 375/98
5,134,631 A * 7/1992 Kingston et al. ........... 375/345
5,659,582 A * 8/1997 Kojima et al. ............... 375/345
6,304,751 B1* 10/2001 King .......................... 455/324
6,748,200 B1* 6/2004 Webster et al. .......... 455/234.1
6,771,715 B1* 8/2004 Rives et al. ................. 375/327
6,775,530 B1* 8/2004 Severson et al. ............ 455/324
6,804,501 B1* 10/2004 Bradley et al. ............. 455/138

FOREIGN PATENT DOCUMENTS

| EP | 1020991 | 7/2000 |
|---|---|---|
| EP | 1083669 | 3/2001 |
| GB | 2347284 | 8/2000 |
| WO | 9620540 | 7/1996 |
| WO | 0001079 | 1/2000 |
| WO | 02067420 | 8/2002 |

\* cited by examiner

*Primary Examiner*—Quochien B. Vuong
(74) *Attorney, Agent, or Firm*—Phillip R. Wadswort; Charles D. Brown; Howard H. Seo

(57) ABSTRACT

An AMPS receiver system utilizing a ZIF architecture and processing received forward link signals in the digital domain. The AMPS receiver system includes an antenna (105), a direct converter (110), high dynamic A/D converters (120,130), low pass filters (140, 150), a phase shifter (160), a digital VGA (170), a digital FM demodulator (180), an accumulator (185) and a controller (190). The direct converter (110) further includes a low noise amplifier (112), a splitter (113), mixers (114,116) and low pass filters (118, 119). The controller (190) adjusts the gains of the low noise amplifier (112) and the digital VGA (170) based on the average power of the signal outputted by the digital VGA (170).

39 Claims, 7 Drawing Sheets

AMPS RECEIVER USING A ZERO-IF ARCHITECTURE

RELATED APPLICATIONS

This application claims priority to Provisional Application No. 60/351,868 filed Jan. 25, 2002.

BACKGROUND OF THE INVENTION

1. Field of the Invention

The present invention relates generally to wireless communication systems and, more particularly, to a system and method for receiving and processing forward link AMPS signals.

2. Description of the Related Art

Wireless communication systems have increased in number and complexity in recent years. It is common that a plurality of wireless service providers may be operating in the same geographic region with overlapping areas of coverage. Furthermore, different wireless service providers may be using different technologies for their systems. Some service providers may use code division multiple access (CDMA) wireless systems while others may use such systems as time division multiple access (TDMA) wireless systems. However, certain regions may only have an analog system available such as the Advanced Mobile Phone Service (AMPS) system. Thus, a wireless communication device (WCD) designed for the CDMA system may not be able to communicate in a region providing only AMPS service.

To solve such problems, many advanced WCDs now have a dual mode capability that allows the WCDs to communicate in both the CDMA system and the AMPS system. The AMPS system is a first generation analog cellular system that uses frequency modulation (FM) for radio transmission.

A typical dual-mode receiver architecture is heterodyne, which uses an analog intermediate frequency (IF) automatic gain control (AGC) circuit consisting of a variable gain amplifier (VGA) in the IF strip to process received forward link signals (i.e., a signal from a base station (BS) to a WCD). In a typical AMPS receiver, a radio frequency (RF) signal detected by the RF stage in the receiver is mixed or translated down to the intermediate frequency. The IF stage may perform additional amplification and/or filtering. However, a new trend in wireless communication devices, particularly in dual-mode CDMA wireless communication devices, is to mix the output of the RF stage directly to baseband frequencies in a zero IF (ZIF) architecture or a low-IF architecture. The ZIF architecture saves cost and circuit space by reducing the total part count. Specifically, in the ZIF architecture, the IF section is removed including filters, VCO (voltage controlled oscillator) etc. However, the utilization of the ZIF architecture in a traditional CDMA receiver when combined with an analog AGC as used in a typical AMPS receiver will be difficult because of DC offset problems and mismatches associated with analog circuits. Thus, a CDMA receiver with a ZIF architecture must use a digital AGC to overcome such problems.

However, traditional AMPS receivers use analog AGCs to process the received forward link signals, but having both analog and digital AGCs in a dual-mode WCD increases the number of parts, manufacturing cost and circuit space.

Therefore, there is a need for an AMPS receiver that is able to use a digital AGC to process the received forward link signals and share the digital AGC with the CDMA receiver to reduce the number of parts, manufacturing cost and circuit space. The present invention provides this and other advantages as will be apparent from the following detailed description and accompanying figures.

SUMMARY OF THE INVENTION

This disclosure is directed to an AMPS receiver utilizing a ZIF architecture and processing received forward link signals in the digital domain, which obviate for practical purposes the above mentioned limitations.

According to an embodiment of the present invention, an AMPS receiver includes a direct converter for converting received forward link RF signals to baseband signals, high dynamic range analog-to-digital (A/D) converters, a phase shifter, a digital VGA, an accumulator, a digital FM demodulator and a controller for controlling the operation of the AMPS receiver.

The direct converter includes a low noise amplifier with a single or multiple gain steps for amplifying the received RF signals, down-mixers for converting the received RF signals to baseband signals and low pass filters. The low noise amplifier changes its gain by changing the gain from one gain step to another gain step based on a command from the controller. However, the changing of the gain causes a phase shift in the phase of the received RF signal amplified by the low noise amplifier.

The controller directs the low noise amplifier to change the gain if the controller detects that the input power to the antenna exceeds a programmable threshold. The controller further directs the phase shifter to change the phase of the signals that have been phase shifted by the low noise amplifier when the low noise amplifier changed its gain. The phase shifter cancels the phase shift caused by the low noise amplifier.

The digital VGA receives the output of the phase shifter and amplifies or attenuates the received signals to a level proper for the digital FM demodulator. The accumulator receives the output of the digital VGA and calculates the average power of the output signal. The controller uses the calculated average power to control the gain of the digital VGA and the low noise amplifier. Finally, the digital FM demodulator demodulates the received forward link signals to retrieve the message signals.

Other features and advantages of the invention will become apparent from the following detailed description, taken in conjunction with the accompanying drawings which illustrate, by way of example, various features of embodiments of the invention.

DETAILED DESCRIPTION OF THE
PREFERRED EMBODIMENTS

Figure 1:
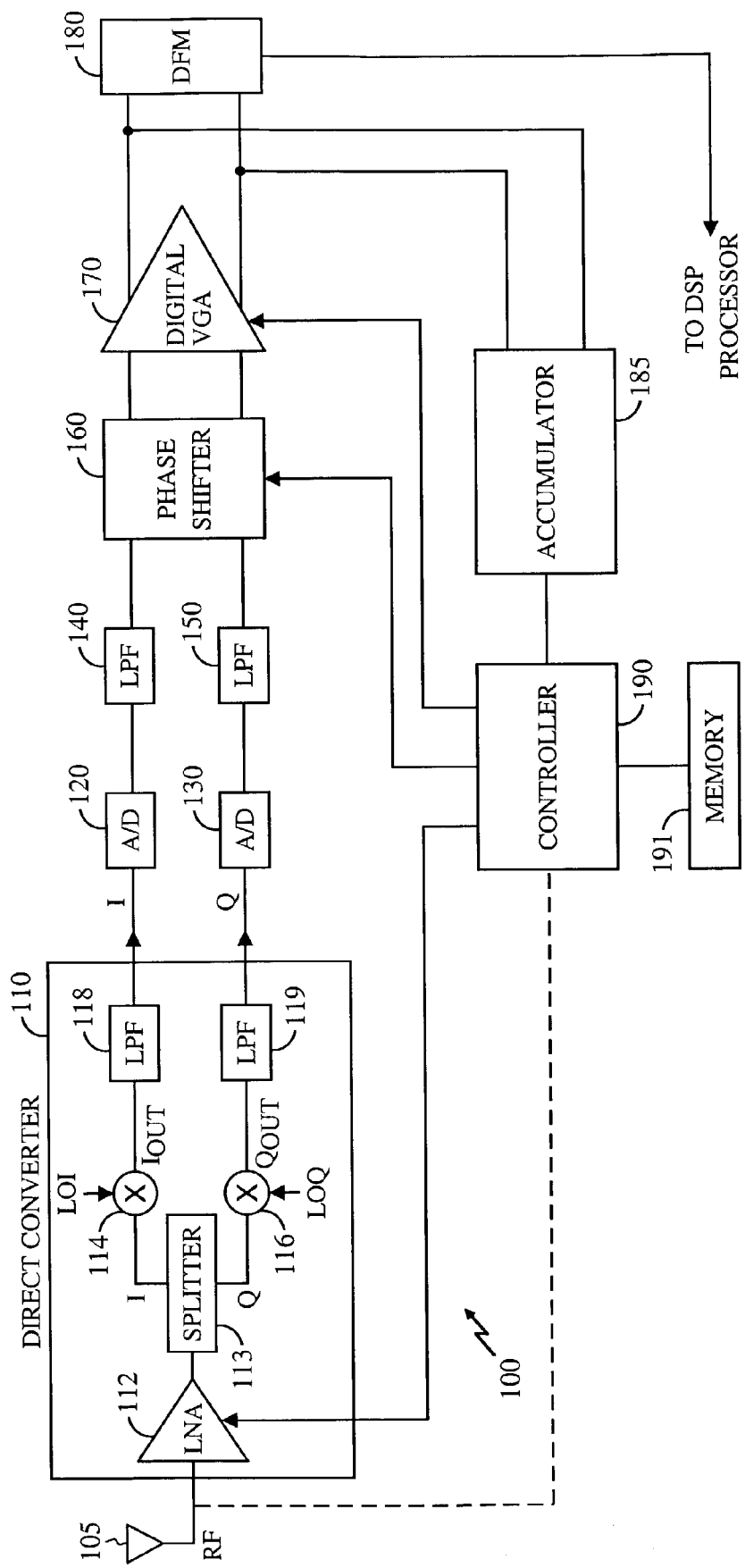
FIG. 1 is a functional block diagram of one implementation of the present invention.

FIG. 1 illustrates an AMPS receiver system 100 in accordance with an embodiment of the present invention. The receiver system 100 includes an antenna 105 for receiving RF forward link signals from various base stations. The operation of the antenna 105 is known in the art and need not be described in detail herein. The antenna 105 is coupled to a direct converter 110. The direct converter 110 directly converts a radio frequency (RF) signal to a baseband signal without going through an intermediate frequency (IF) stage. The forward link signals received by the antenna 105 are RF signals and are converted to baseband signals by the direct converter 110. In an embodiment of the present invention, the baseband signals include zero IF and low IF signals.

The direct converter 110 includes a low noise amplifier (LNA) 112, a splitter 113, down-mixers 114 and 116 and filters 118 and 119. The LNA 112 receives the forward link signals from the antenna 105 and amplifies the forward link signals. The LNA 112 has a single or multiple gain steps to amplify the received forward link signals with different gains. The gain of the LNA 112 is changed by changing the gain from one gain step to another gain step based on the strength of the received forward link signal (i.e., the power of the received forward link signal), which typically has a range of −25 dBm to −125 dBm. The strength (power) of the received forward link signal has a wide range because of "fading" such as Rayleigh fading and the variation in the distance from the receiver system 100 to the base station serving the receiver system 100. The controller 190 selects the appropriate gain step for the LNA 112, as explained in greater detail below.

In the mobile environment, signals are reflected and scattered by obstacles in their paths including buildings, hillsides, trees, vehicles, etc. The scattering of the signals results in multiples copies of the same signal arriving at the receiving antenna. These multiple copies, however, take different paths, and so the multiple copies arrive at the receiving antenna offset in time. This offset can cause the signals to add in a destructive way at one moment and reinforce each other in the next moment. This phenomenon is called "fast fading." Thus, fading causes fluctuation in the strength of the received signals.

Furthermore, the rate of fading is related to the wavelength of the received signals and the velocity of a WCD receiving the signals. For example, a WCD on a car traveling at 70 m.p.h may experience fading at 200 times per second. Therefore, the gain of the LNA 112 needs to be changed at an appropriate rate to accommodate the fluctuation of the strength of the received forward link signals.

Figure 3:
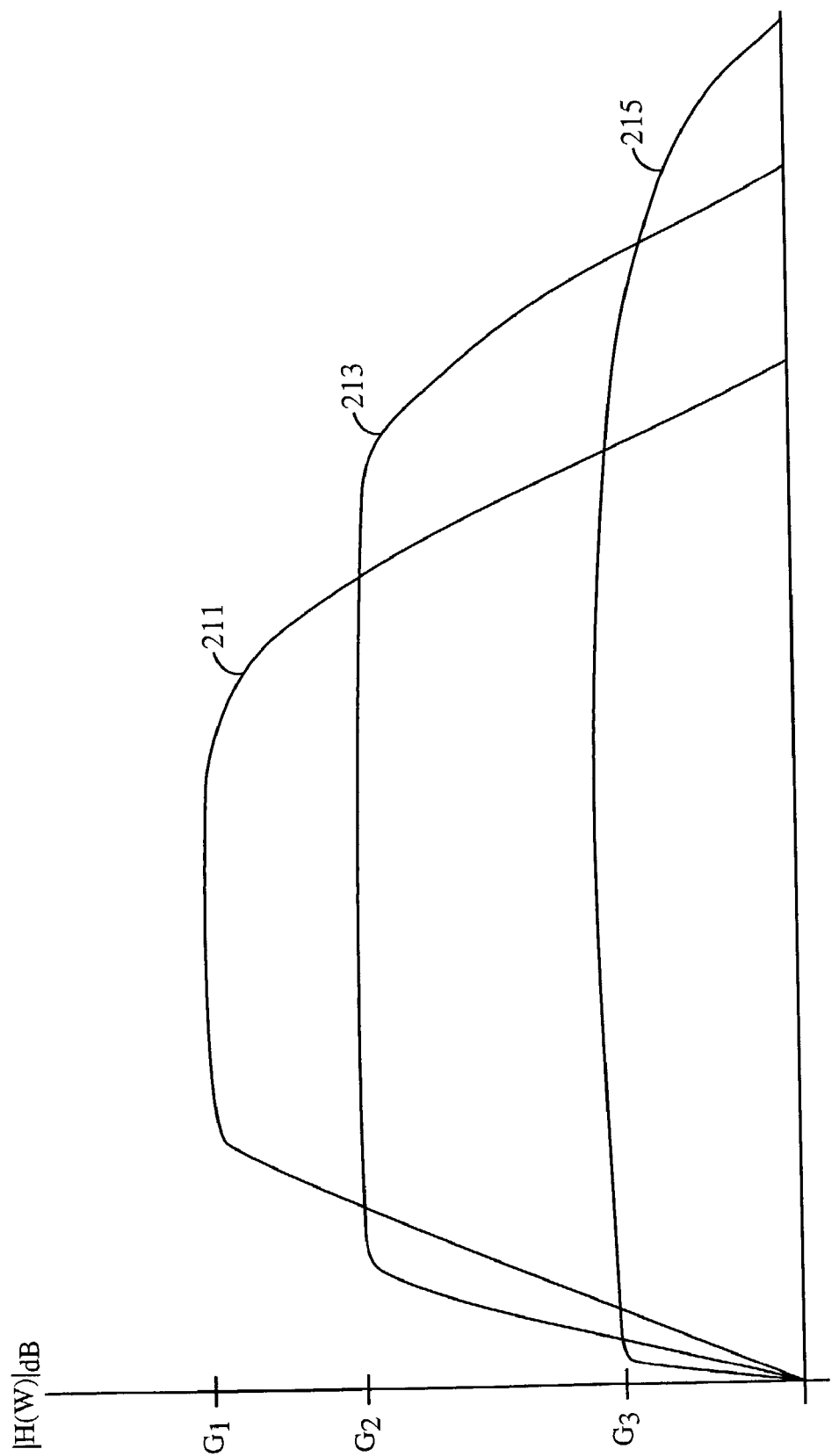
FIG. 3 illustrates sample gain steps of a low noise amplifier in an AMPS receiver system in accordance with an embodiment of the present invention.

FIG. 3 illustrates the gain steps of the LNA 112. A curve 211 has a gain of G1, a curve 213 has a gain of G2, and a curve 215 has a gain of G3. In addition, the LNA 112 may have just an unity gain (i.e., $|H(w)|_{dB}=0$) or may have a negative gain (i.e., the input signal is attenuated (e.g., $|H(w)|_{dB}=-20$ dB)). Thus, the gain of the LNA 112 can vary from negative gain to positive gain. For example, if the power of a received forward link signal is weak, e.g., −125 dBm, the gain of the LNA 112 may be increased from G3 to G1. On the other hand, if the power of a received forward link signal is strong, e.g., −25 dBm, the gain of the LNA 112 may be decreased from G1 to G2. The LNA 112 may have less or more than the three gain steps illustrated in FIG. 3, which is used for illustrative purposes. The gain of the LNA 112 is controlled by a controller 190 (see FIG. 1), which may be a processor, a CPU, a DSP processor, a hardware state machine or a micro controller. The controller 190 sends a gain control signal to the LNA 112 to change the gain of the LNA 112. The operation of the controller 190 will be explained in greater detail below.

When the controller 190 changes the gain of the LNA 112, the LNA 112 also changes the phase of the received forward link signals. In other words, when the LNA 112 changes its gain by going to another gain step, the LNA 112 causes a phase shift in the received forward link signals. Thus, the amplified signal outputted by the LNA 112 has a phase shift.

Figure 2:
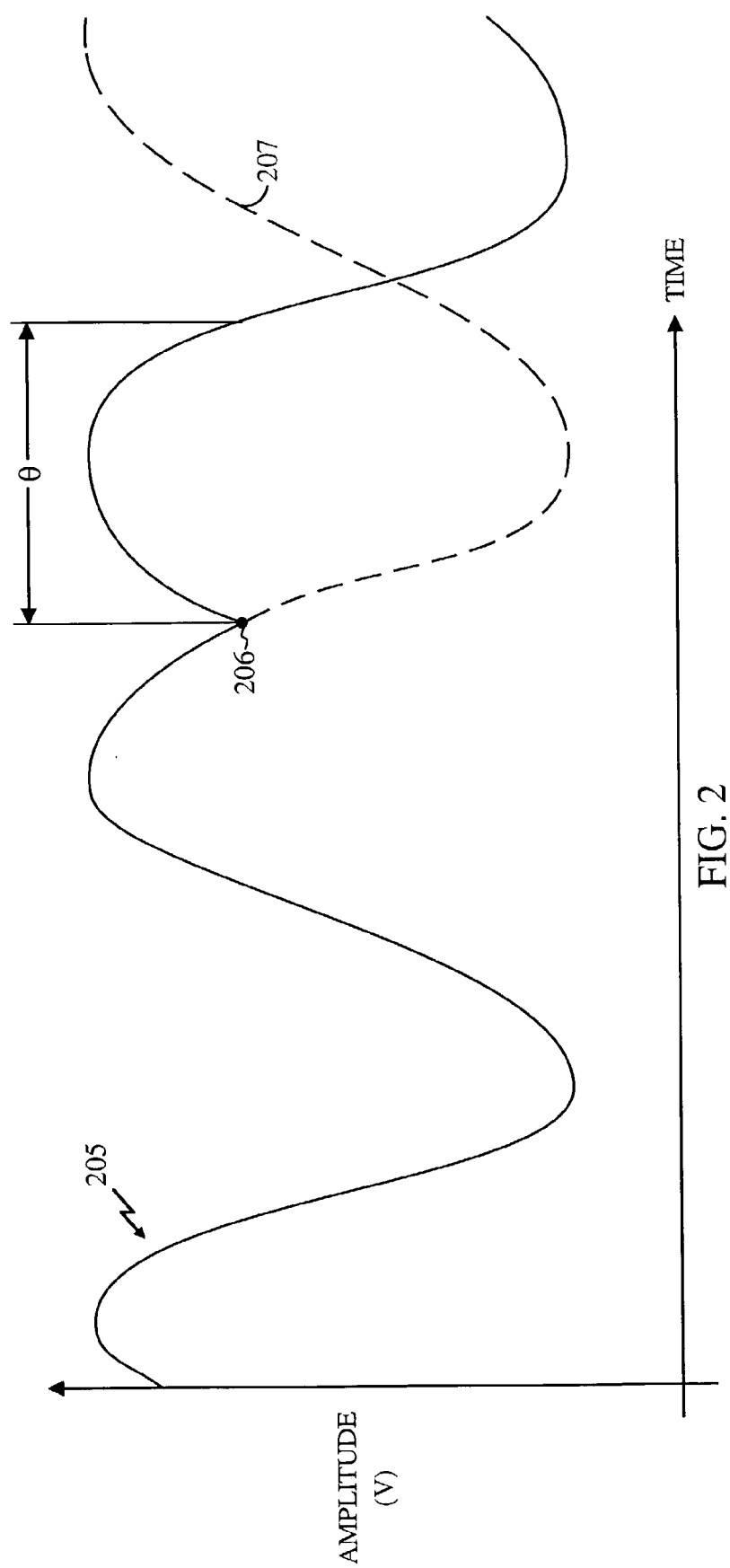
FIG. 2 illustrates a sample output signal of a low noise amplifier in an AMPS receiver system in accordance with an embodiment of the present invention.

FIG. 2 shows a curve 205 representing an output of the LNA 112. At a point 206, the controller 190 changes the gain of the LNA 112. As a result of the gain change, the LNA 112 causes a sudden phase shift of "θ" in the curve 205. Therefore, instead of following the path traced by a curve 207, the curve 205 follows a path that has a phase shift of θ. The sudden phase shift in the output of the LNA 112 may cause certain problems later. However, a phase shifter 160 solves that problem, as explained in greater detail below.

As shown in FIG. 1, the output of the LNA 112 is coupled to a splitter 113, which splits the output signal into two identical signals for subsequent quadrature demodulation. The two identical outputs from the splitter 113 are coupled to identical down-mixers 114 and 116. A conventional down-mixer receives a radio frequency signal and a local oscillator signal as inputs and generates outputs as the sum and difference frequencies of the two input signals. The down-mixers 114 and 116 are identical in operation except for the phase of the local oscillator. The local oscillator provided to the down-mixer 114 is designated as a local oscillator LOI, while the local oscillator provided to the down-mixer 116 is designated as a local oscillator LOQ. The local oscillators LOI and LOQ have identical frequency but have a phase offset of 90° with respect to each other. Therefore, the output of the down-mixers 114 and 116 are quadrature outputs designated as $I_{OUT}$ and $Q_{OUT}$, respectively. As noted above, the system illustrated in the functional block diagram of FIG. 1 uses a direct-to-baseband or a ZIF architecture. Accordingly, the local oscillators LOI and LOQ are selected to mix the RF signal from the LNA 112 directly down to baseband frequency that includes either zero IF or low IF frequency signals or both.

The outputs from the down-mixers 114 and 116 are coupled to filters 118 and 119. The filters 118 and 119 are analog low pass filters (LPF) that select the desired channel and attenuate out-of-band jammers. The filters 118 and 119 output zero IF or low IF signals.

The outputs of the filters 118 and 119 are received by analog-to-digital converters (ADC) 120 and 130, respectively. The ADCs 120 and 130 convert the received signals to digital form for subsequent processing. The operation of the ADCs 120 and 130 are well known in the art and need not be described in any greater detail herein. Although any type of ADC may be used to implement the ADCs 120 and 130, the system 100 is ideally suited for operation with high dynamic range noise-shaped ADCs, such as a Delta-Sigma ADC, or other noise-shaped ADCs. Typically, the dynamic range of an ADC is 10*log(maximum signal/noise of the ADC). The present invention is not limited by the specific form of the ADCs.

In an embodiment of the present invention, due to current consumption constraints, the dynamic range of the ADCs 120 and 130 are limited to around 60–75 dB. However, the received forward link signals have a dynamic range of about 100 dB as explained above. Although higher dynamic range ADCs can be used for ADCs 120 and 130 to accommodate the 100 dB dynamic range of the received forward link signals, the higher dynamic range ADCs increase the manufacturing cost of the circuit and consume additional battery power.

Figure 4:
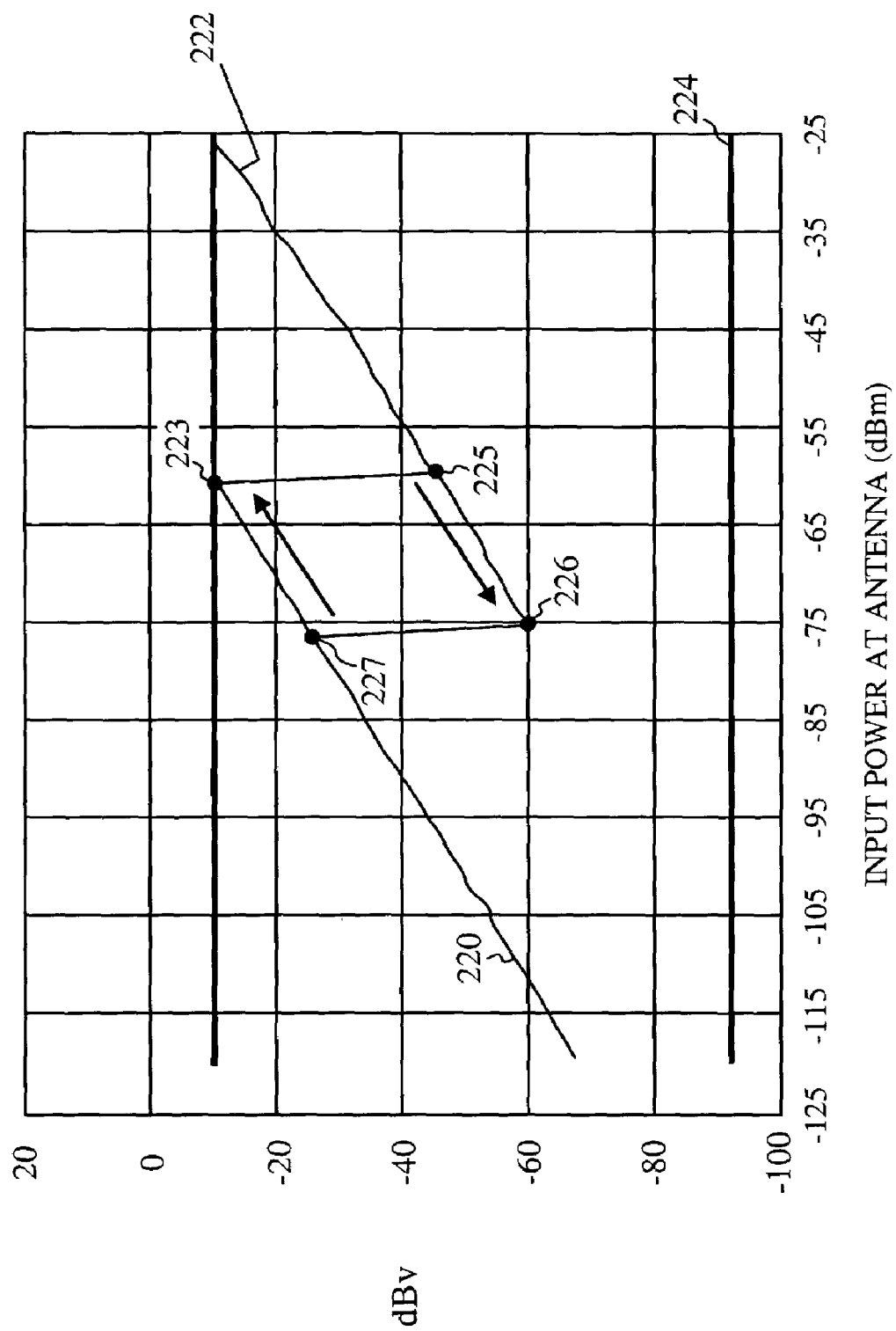
FIG. 4 illustrates a sample input voltage signal for a high dynamic range A/D converter in an AMPS receiver system in accordance with an embodiment of the present invention.

As a result of using ADCs having a dynamic range lower than the dynamic range of the received forward link signals, certain forward link signals may saturate the ADCs 120 and 130. FIG. 4 illustrates a curve 220 that represents the input voltage of the ADCs 120 and 130. A line 222 represents the upper dynamic range limit of the ADCs 120 and 130, and a line 224 represents the lower dynamic range limit of the ADCs 120 and 130. As discussed above, the range represented by the upper limit 222 and the lower limit 224 is less than 100 dB. At a point 223, the input voltage of the ADCs 120 and 130 reaches the upper limit 222, so if the input voltage increases above the upper limit 222, the ADCs 120 and 130 will become saturated.

Therefore, to prevent such saturation, when the input voltage to the ADCs 120 and 130 reaches the upper limit 222, the controller 190 sends a gain control command to the LNA 112 to lower the gain of the LNA 112. The LNA 112 in response to the control command lowers the gain, e.g., from G1 to G2. When the gain of the LNA 112 is lowered, the input voltage to the ADCs 120 and 130 is also lowered, as shown in FIG. 4 at a point 225. At the point 223, the LNA 112 lowers the gain step, and the input voltage drops from the voltage at the point 223 to the voltage at the point 225, thereby preventing the saturation of the ADCs 120 and 130. On the other hand, if the input voltage drops down to a certain level, the controller 190 sends a command to the LNA 112 to increase the gain. At a point 226, the controller 190 sends a command to increase the gain of the LNA 112. Thus, the input voltage to the ADCs 120 and 130 is increased to the voltage at the point 227. However, as discussed above, the changing of the gain step in the LNA 112 creates a sudden change of phase shift in the output of the LNA 112.

In FIG. 4, the switching point 223 occurs when the input power (i.e., the power of the received RF forward link signals) at the antenna 105 is approximately at −60 dBm, and the switching point 226 occurs when the input power at the antenna 105 is approximately at −75 dBm. However, in embodiments of the present invention, the switching point 223 may occur when the input power to the antenna 105 is above or below −60 dBm. Similarly, the switching point 226 may occur when the input power to the antenna 105 is above or below −75 dBm. The input power points at which the LNA 112 switches the gain step can be programmed or changed. For example, the controller 190 may instruct the LNA 112 to lower the gain when the input power is at −65 dBm and instruct the LNA 112 to increase the gain when the input power is at −80 dBm as long as such change does not saturate the ADCs 120 and 130. In other words, if the input power exceeds a programmable threshold value, the controller 190 sends a command to the LNA 112 to lower the gain, and if the input power dips below a certain programmable threshold value, the controller 190 sends a command to the LNA 112 to increase the gain of the LNA 112. The programmable threshold values can be stored in a lookup table in a memory 191, which is connected to the controller 190. The memory 191 may be external or internal to the controller 190 and can be a random access memory, a read-only memory, EEPROM, a flash memory or any medium used to store the desired information.

The instructions for causing the controller 190 to implement the operational modes described herein may be stored on processor readable media. By way of example, and not limitation, processor readable media may comprise storage media and/or communication media. Storage media includes volatile and nonvolatile, removable and fixed media implemented in any method or technology for storage of information such as processor-readable instructions, data structures, program modules, or other data. Storage media may include, but is not limited to, random access memory (RAM), read-only memory (ROM), EEPROM, flash memory, fixed or removable disc media, including optical or magnetic media, or any other medium that can be used to store the desired information and that can be accessed by the controller 190.

Digital low pass filters 140 and 150 (see FIG. 1) receive the outputs of the ADCs 120 and 130, respectively. The filters 140 and 150 attenuate quantization noise present in the received signals and perform jammer filtering.

After the filtering, a phase shifter 160 receives the output of the filters 140 and 150. The phase shifter 160 may be any type of phase shifting circuit that changes the phase of the received signal such as a cordic rotator. The phase shifter 160 is not limited to any particular type of phase shifting apparatus. As discussed earlier, changing the gain of the LNA 112 changes the phase of the output signal of the LNA 112 by "θ". In a particular embodiment of the present invention, the phase shifter 160 may be a cordic rotator which is a type of digital mixer that performs either a dynamic or static phase shift on a signal. In a static phase shift, the phase shifter 160 takes the input signal and advances or retards the input signal by a certain amount of phase. Basically, the phase shifter 160 removes the phase shift caused by the gain change in the LNA 112. If the gain change causes a phase shift of "θ", the controller 190 sends a control signal to the phase shifter 160 to impart a phase shift of "−θ" or approximately "−θ" on the phase shifted signal to cancel out the phase shift caused by the LNA 112. Thus, when the controller 190 commands the LNA 112 to change the gain step, the controller 190 also sends a command to the phase shifter 160 to perform a phase shift to remove the phase shift caused by the LNA 112. Since the controller 190 knows in advance the amount of the phase shift change caused by gain step changes, the controller 190 sends a command to the phase shifter 160 to impart an appropriate amount of phase shift (i.e., a phase shift that is approximately equal and opposite to the phase shift caused by the LNA 112) to the signal received by the phase shifter 160. If the gain in the LNA 112 is not changed, the phase shifter 160 does not impart any phase shift to its input signal. In other words, the controller 190 does not send any command to the phase shifter 160 to create a phase shift.

Furthermore, after the controller 190 sends a command to the LNA 112 to change the gain step, the controller 190 waits for a certain time period before sending a command to the phase shifter 160 to impart an appropriate phase shift. The waiting time period is equal to the signal propagation delay from the LNA 112 to the phase shifter 160. Another term for the propagation delay is group delay. Thus, the controller waits for a time period equal to the propagation delay before sending out a command to the phase shifter 160 to cause a phase shift so that the signal phase shifted by the LNA 112 is given the time to arrive at the phase shifter 160 before being phase shifted by the phase shifter 160. In other words, the controller 190 synchronizes the propagation delay from the LNA 112 to the phase shifter 160. The actual amount of the propagation delay time is stored in the memory 191 and is programmable. The removal of the phase shift caused by the LNA 112 is important for a reason explained in greater detail below.

Since the AMPS system uses frequency modulation, a forward link signal can be expressed as follows:

$$S_{FM}(t) = A_c \cos\left[2\pi f_c t + 2\pi k_f \int_{-\infty}^{t} m(\eta) d\eta\right]$$

where $A_c$=the amplitude of the carrier signal;
$f_c$=the frequency of the carrier signal;
$k_f$=frequency deviation constant; and
m(t)=the message signal.

After receiving the forward link signal $S_{FM}(t)$, an AMPS receiver demodulates the forward link signal to retrieve the message signal m(t). A typical AMPS receiver in a WCD may have an analog or a digital FM demodulator (DFM) to demodulate the forward link signal and retrieve the message signal m(t). The AMPS receiver system 100 in accordance with an embodiment of the present invention has a DFM 180 to demodulate the forward link signal. The DFM 180 basically performs an operation equivalent to differentiation (i.e., taking the time derivative) of the received forward link signal to demodulate the forward link signal.

However, as shown on FIG. 2, the signal 205 outputted by the LNA 112 has a sudden phase shift of θ at the point 206 because of the gain change at the LNA 112. Since the phase was abruptly changed at the point 206, a singularity point is created in the derivative at the point 206. As discussed previously, the DFM 180 performs a differentiation operation to demodulate the received forward link signals. When the DFM 180 performs a differentiation operation on a point with abrupt phase change, such as the point 206, the DFM 180 creates a sudden spike in the output of the DFM 180. The sudden spike results in a loud "click" noise to the listener/user of a WCD. Furthermore, if the WCD is traveling at a high speed, the rate of fading increases, which results in an increase of the number of "click" noises.

Figure 5:
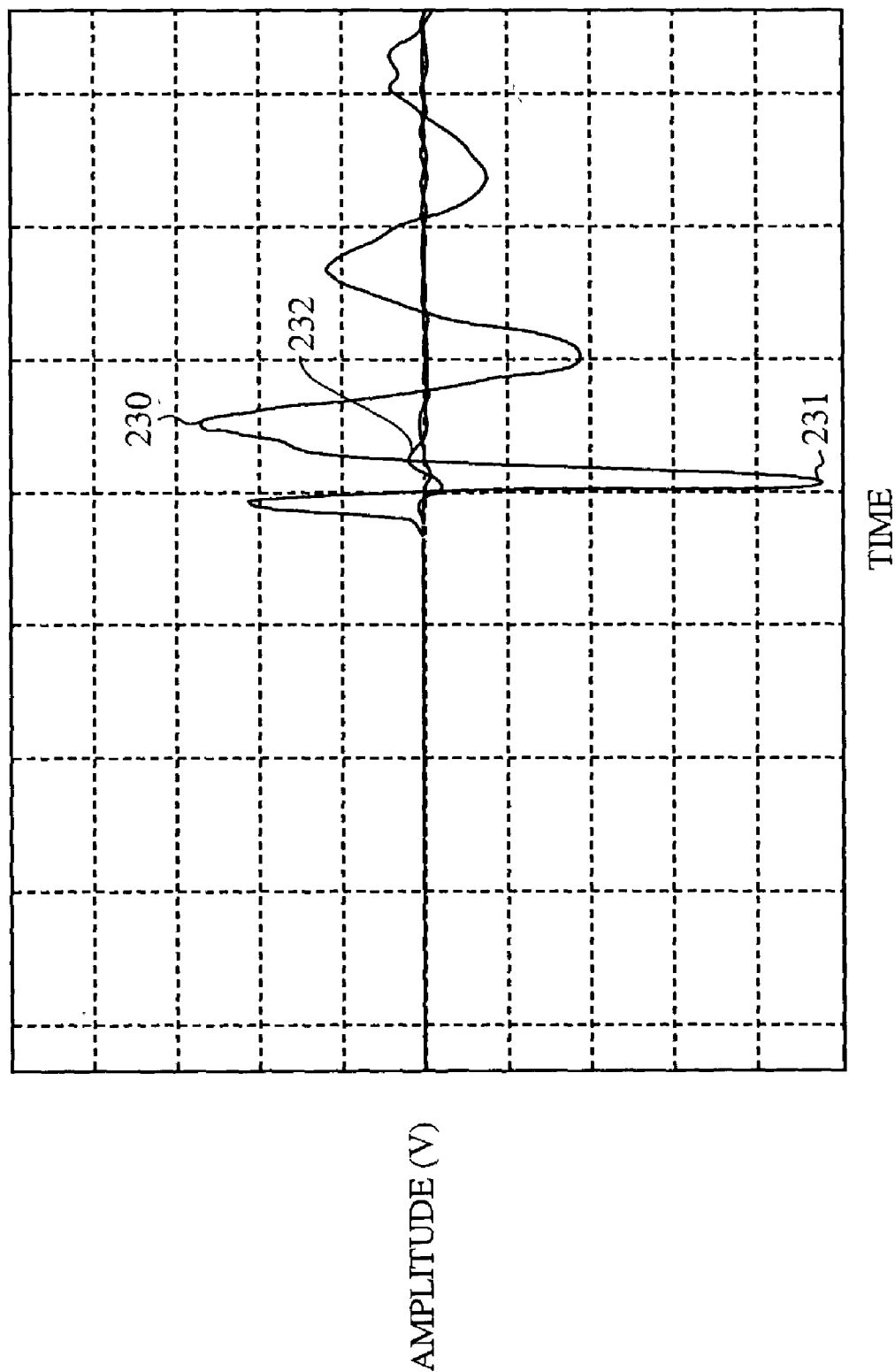
FIG. 5 illustrates sample outputs of a digital FM demodulator in an AMPS receiver system in accordance with an embodiment of the present invention.

FIG. 5 illustrates a curve 230 that represents the output of the DFM 180 for an unmodulated carrier without the removal of the phase shift caused by the LNA 112. The curve 230 has a sudden spike at a point 231 that was created by a differentiation of a singularity point. The spike at the point 231 causes a "click" noise to the listener of the WCD. A curve 232 that was represents the output of the DFM 180 for an unmodulated carrier with the removal of the phase shift caused by the LNA 112. The curve 232 does not have any large sudden spikes that may cause "click" noises since the phase shifter 160 removed any abrupt transition in phase caused by the gain step change in the LNA 112.

Therefore, in order to prevent "click" noises, the phase shifter 160 must remove the phase shift caused by the gain step change in the LNA 112. The operation of the phase shifter 160 can be expressed mathematically as follows:

$$[I\ Q]_{correct} = [I\ Q]_{in} \begin{bmatrix} \cos\theta & \sin\theta \\ -\sin\theta & \cos\theta \end{bmatrix}$$

$[I\ Q]_{corrected}$=the output of the phase shifter 160;
$[I\ Q]_{in}$=the input of the phase shifter 160.

In summary, the phase shifter 160 removes the phase shift caused by the LNA 112 to prevent the creation of "click" noises.

A digital variable gain amplifier (DVGA) 170 receives the output of the phase shifter 160. The DVGA 170 amplifies or attenuates the input signal to a level proper for the DFM 180, as explained in greater detail below. The DVGA 170 has a control input for receiving control signals from the controller 190 to control the gain of the DVGA 170.

The accumulator 185 receives the output of the DVGA 170 and calculates the average power of its received input signal over a certain period of time. The time period over which the average power is calculated can be easily determined and implemented by those skilled in the art based on particular needs and specifications. In embodiments of the present invention, it is desired to hold the calculated average power to be equal to a constant set point.

P=average power=constant set point.

The controller 190 receives the calculated average power and tries to maintain the average power to be equal to the constant set point by adjusting the gain of the DVGA 170 and the LNA 112. The LNA 112 is used for the coarse adjustment of the average power, and the DVGA 170 is used for the fine adjustment of the average power. The controller 190 sends out respective digital control signals to the LNA 112 and the DVGA 170 to control the gain so that the average power is maintained at the constant set point.

The DFM 180 receives the output of the DVGA 170 and demodulates the input signal to retrieve the message signal m(t) as discussed above. A DSP processor (not shown) receives the output of the DFM 180 to further filter and process the output signal of the DFM 180 to produce an audible sound for the user of the WCD.

Figure 6:
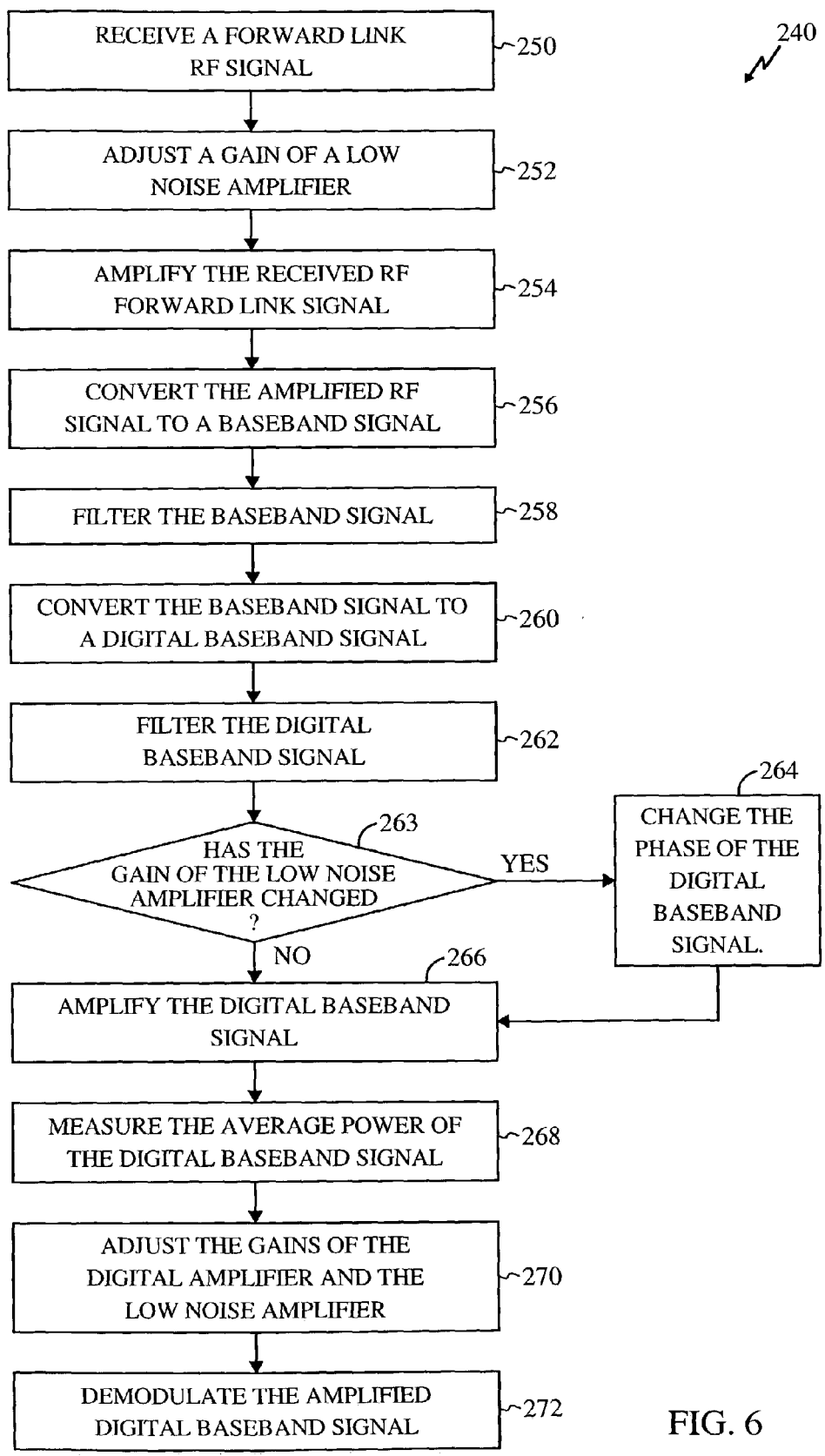
FIG. 6 illustrates a flow diagram outlining a signal processing method in accordance with an embodiment of the present invention.

FIG. 6 illustrates a flow chart outlining a signal processing method 240 in accordance with an embodiment of the present invention. In step 250, a RF forward link signal is received. In step 252, the gain of a low noise amplifier is adjusted based on the power of the received RF forward link signal. In step 254, the RF forward link signal is amplified by the low noise amplifier. In step 256, the amplified RF forward link signal is converted to a baseband signal. In step 258, the baseband signal is filtered by an analog filter. In step 260, the baseband signal is converted to a digital baseband signal. In step 262, the digital baseband signal is filtered by a digital filter. In step 263, it is determined whether the gain of the low noise amplifier was changed. If the gain was changed, the control is passed to step 264, and if the gain was not changed, the control is passed to step 266. In step 264, the phase of the digital baseband signal is changed based on the gain change of the low noise amplifier. In step 266, the digital baseband signal is amplified by a digital amplifier. In step 268, the average power of the amplified digital baseband signal is measured. In step 270, the gains of the digital amplifier and the low noise amplifier are adjusted based on the average power of the amplified digital baseband signal. In step 272, the amplified digital baseband signal is demodulated.

Figure 7:
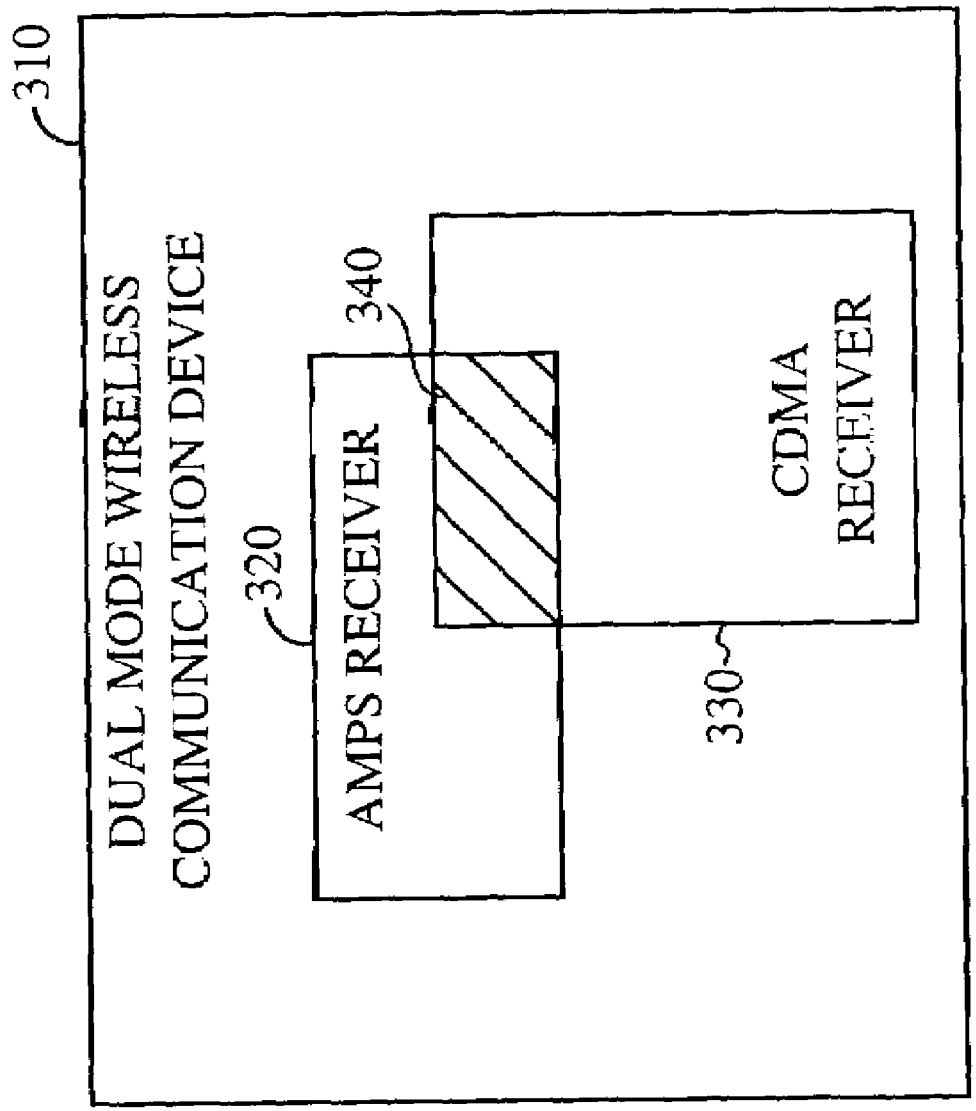
FIG. 7 illustrates a dual mode wireless communication device in accordance with an embodiment of the present invention.

FIG. 7 illustrates a dual-mode wireless communication device (DMWCD) 310 in accordance with an embodiment of the present invention. The DMWCD 310 includes an AMPS receiver 320 and a CDMA receiver 330. The AMPS receiver 320 and the CDMA receiver 330 share a portion of their circuitry with each other. The shared circuitry portion is designated as a shaded area 340 in FIG. 7. The shared portion 340 includes a digital AGC circuit and other circuitries that may be shared between the AMPS receiver 320 and the CDMA receiver 330. In embodiments of the present invention, the shared portion 340 includes the digital low pass filters 140, phase shifter 160, digital VGA 170, accumulator 185 and controller 190 shown on FIG. 1. The digital low pass filters 140, phase shifter 160, digital VGA 170, accumulator 185 and controller 190 form a part of the digital AGC circuit. The sharing of circuit elements between the AMPS receiver 320 and the CDMA receiver 330 reduces manufacturing cost and circuit space.

It is to be understood that even though various embodiments and advantages of the present invention have been set forth in the foregoing description, the above disclosure is illustrative only, and changes may be made in detail, yet remain within the broad principles of the invention. Therefore, the present invention is to be limited only by the appended claims.

What is claimed is:

1. Ant AMPS receiver system, comprising:
   an antenna for receiving a radio frequency (RF) signal transmitted from a remote location;
   a direct converter for converting the received RF signal to a baseband signal;
   an analog-to-digital convert (ADC) for converting the baseband signal to a digital baseband signal;
   a digital variable gain amplifier (DVGA) for amplifying the digital baseband signal to generate an amplified digital baseband signal, the DVGA having a DVGA control input for adjusting a gain of the DVGA;
   an accumulator for calculating an average power of the amplified digital baseband signal over a time period;
   a controller for receiving the calculated average power and maintaining the average power to a constant set point by sending a DVGA gain control signal to the DVGA control input to adjust the gain of the DVGA; and
   a digital FM demodulator for demodulating the amplified digital baseband signal to retrieve a message signal.

2. The AMPS receiver system of claim 1, wherein the direct converter includes:
   a low noise amplifier (LNA) for amplifying the received RF signal to generate an amplified RF signal, the LNA having at least one gain step and a gain step control input for controlling the gain of the LNA; and
   a mixer for converting the amplified RF signal to the baseband signal.

3. The AMPS receiver system of claim 2, wherein the controller sends a LNA gain control signal to the gain step control input to control the gain of the LNA.

4. The AMPS receiver system of claim 3, wherein the controller sends the LNA gain control signal to the gain step control input to maintain the average power to the constant set point.

5. The AMPS receiver system of claim 3, wherein the controller sends the LNA gain control signal to lower the gain of the LNA if a power of the received RF signal exceeds a first programmable value.

6. The AMPS receiver system of claim 5, wherein the controller sends the LNA gain control signal to increase the gain of the LNA if the power of the received RF signal drops below a second programmable value.

7. The AMPS receiver system of claim 6, wherein a dynamic range of the power of the received RF signal is greater than a dynamic range of the ADC.

8. The AMPS receiver system of claim 3, further comprising:
   a phase shifter for changing a phase of the digital baseband signal.

9. The AMPS receiver system of claim 8, wherein the controller sends a phase change control signal to the phase shifter to change the phase of the digital baseband signal if the controller sends the LNA gain control signal to change the gain of the LNA.

10. The AMPS receiver system of claim 9, wherein the phase shifter is a cordic rotator.

11. The AMPS receiver system of claim 10, wherein the phase shifter changes the phase of the digital baseband signal by an amount approximately equal and opposite to the phase change caused by the gain change of the LNA on the received RF signal.

12. The AMPS receiver system of claim 1, further comprising a digital filter for removing noises in the digital baseband signal.

13. The AMPS receiver system of claim 1, wherein the direct converter includes an analog filter for filtering noises in the baseband signal.

14. The AMPS receiver system of claim 2, wherein the direct converter further includes a splitter for splitting the amplified RF signal into two identical signals.

15. An AMPS receiver circuit, comprising:
   a direct converter for amplifying a received RF signal according to a selected one of a plurality of gains and converting the received RF signal to a baseband signal;
   an analog-to-digital converter (ADC) for converting the baseband signal to a digital baseband signal;
   a phase shifter for changing a phase of the digital baseband signal; and
   a controller for sending a phase control signal to the phase shifter to control the phase of the digital baseband signal based in part on a change of the selected one of the plurality of gains.

16. The AMPS receiver circuit of claim 15, wherein the controller sends the phase control signal to the phase shifter to change the phase of the digital baseband signal after waiting for a propagation delay time if the direct converter changes a phase of the received RF signal.

17. The AMPS receiver circuit of claim 16, wherein the direct converter includes:
   a low noise amplifier (LNA) for amplifying the received RF signal to generate an amplified RF signal, the LNA having at least one gain step and a gain step control input for controlling the gain of the LNA; and
   a mixer for converting the amplified RF signal to the baseband signal.

18. The AMPS receiver circuit of claim 17, wherein the controller sends a LNA gain control signal to the gain step control input based on a power of the received RF signal.

19. The AMPS receiver circuit of claim 15, further comprising a digital variable gain amplifier (DVGA) for amplifying the digital baseband signal to generate an amplified digital baseband signal,
   wherein the controller sends a DVGA gain control signal to the DVGA to control the gain of the DVGA.

20. The AMPS receiver circuit of claim 19, further comprising an accumulator for calculating an average power of the amplified digital baseband signal.

21. The AMPS receiver circuit of claim 20, wherein the DVGA gain control signal is based on the avenge power of the amplified digital baseband signal.

22. The AMPS receiver circuit of claim 21, further comprising a digital FM demodulator for demodulating the amplified digital baseband signal to retrieve a message signal.

23. The AMPS receiver circuit of claim 22, further comprising a digital filter for removing noises in the digital baseband signal.

24. An AMPS receiver circuit comprising:
a low noise amplifier (LNA) for amplifying a received RF signal according to a gain from a plurality of discrete gains to generate an amplified RF signal;
a mixer for converting the amplified RF signal to a baseband signal;
an analog-to-digital convert (ADC) for converting the baseband signal to a digital baseband signal;
a phase shifter for changing a phase of the digital baseband signal; and
a controller for controlling the gain of the LNA and the phase change of the phase shifter based in part on a change of the gain of the LNA.

25. The AMPS receiver circuit of claim 24, wherein the controller changes the gain of the LNA based on a power of the received RF signal.

26. The AMPS receiver circuit of claim 25, wherein the LNA changes a phase of the received RF signal when the controller changes the gain of the LNA.

27. The AMPS receiver circuit of claim 26, wherein the phase change of the phase shifter is approximately equal and opposite to the phase change of the received RF signal caused by the gain change of the LNA.

28. The AMPS receiver circuit of claim 24, further comprising:
a digital variable gain amplifier (DVGA) for amplifying the digital baseband signal to generate an amplified digital baseband signal.

29. The AMPS receiver circuit of claim 28, wherein the controller controls a gain of the DVGA based on an average power of the amplified digital baseband signal.

30. The AMPS receiver circuit of claim 29, wherein the controller controls the gain of the LNA based on the average power of the amplified digital baseband signal.

31. The AMPS receiver circuit of claim 28, further comprising a digital FM demodulator for demodulating the amplified digital baseband signal to retrieve a message signal.

32. A method of processing a received radio frequency (RF) signal, the method comprising the steps of:
amplifying the received RF signal by a programmable amplification from a range of amplification levels to generate an amplified RF signal;
converting the amplified RF signal to a baseband signal;
converting the baseband signal to a digital baseband signal;
amplifying the digital baseband signal to generate an amplified digital baseband signal;
controlling the amplification of the received RF signal and the digital baseband signal based on an average power of the amplified digital baseband signal; and
changing a phase of the digital baseband signal based on a change of the amplification of the RF signal.

33. The method of claim 32, further comprising the step of:
changing the amplification of the RF signal based on a power of the received RF signal.

34. The method of claim 33, further comprising the step of:
filtering noises in the digital baseband signal.

35. The method of claim 34, further comprising the step of:
demodulating the amplified digital baseband signal to retrieve a message signal.

36. A system for processing a received radio frequency (RF) signal, comprising:
means for amplifying the received RF signal based on a programmable amplification from a plurality of discrete programmable amplification levels to generate an amplified RF signal;
means for converting the amplified RF signal to a baseband signal;
means for converting the baseband signal to a digital baseband signal;
means for amplifying the digital baseband signal to generate an amplified digital baseband signal;
means for controlling the amplification of the received RF signal and the digital baseband signal based on an average power of the amplified digital baseband signal; and
means for changing a phase of the digital baseband signal based on a change of the amplification of the received RF signal.

37. The system of claim 36, further comprising:
means for changing the amplification of the received RF signal based on a power of the received RF signal.

38. The system of claim 37, further comprising:
means for filtering noise in the digital baseband signal.

39. The system of claim 38, further comprising:
means for demodulating the amplified digital baseband signal to retrieve a message signal.

* * * * *